United States Patent
Zhang et al.

(10) Patent No.: US 10,263,147 B2
(45) Date of Patent: Apr. 16, 2019

(54) LIGHT EMITTING DIODE AND FABRICATION METHOD THEREOF

(71) Applicant: XIAMEN SANAN OPTOELECTRONICS TECHNOLOGY CO., LTD., Xiamen (CN)

(72) Inventors: Jie Zhang, Xiamen (CN); Xueliang Zhu, Xiamen (CN); Chengxiao Du, Xiamen (CN); Jianming Liu, Xiamen (CN); Chen-ke Hsu, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 15/723,720

(22) Filed: Oct. 3, 2017

(65) Prior Publication Data

US 2018/0026156 A1   Jan. 25, 2018

Related U.S. Application Data

(63) Continuation of application No. PCT/CN2016/097806, filed on Sep. 1, 2016.

(30) Foreign Application Priority Data

Nov. 24, 2015   (CN) .......................... 2015 1 0820041

(51) Int. Cl.
| | | |
|---|---|---|
| *H01L 31/0256* | (2006.01) | |
| *H01L 33/16* | (2010.01) | |
| *H01L 33/00* | (2010.01) | |
| *H01L 33/32* | (2010.01) | |
| *H01L 33/12* | (2010.01) | |

(52) U.S. Cl.
CPC .......... *H01L 33/16* (2013.01); *H01L 33/0075* (2013.01); *H01L 33/325* (2013.01); *H01L 33/12* (2013.01); *H01L 33/32* (2013.01)

(58) Field of Classification Search
CPC ... H01L 33/16; H01L 33/0075; H01L 33/325; H01L 33/12; H01L 33/32
USPC .......................................................... 257/76
See application file for complete search history.

(56) References Cited

U.S. PATENT DOCUMENTS

| | | | | |
|---|---|---|---|---|
| 7,135,716 B2* | 11/2006 | Kim | ........................ | H01L 33/12 257/103 |
| 7,820,246 B2* | 10/2010 | Sumiya | ................... | C30B 25/02 117/103 |
| 2011/0254048 A1* | 10/2011 | Amano | ................... | C30B 25/20 257/103 |

* cited by examiner

*Primary Examiner* — Vu A Vu
(74) *Attorney, Agent, or Firm* — Syncoda LLC; Feng Ma

(57) ABSTRACT

A light-emitting diode (LED) chip includes from bottom to up: a conductive substrate, a p-type nitride layer, an active layer, an n-type recovery layer, an n-type nitride layer and an n electrode, wherein the n-type nitride layer has a nitride polarity crystal and a gallium polarity crystal, and the surfaces of the nitride polarity and the gallium polarity regions appear different in height, the n-type recovery layer surface approximate to the n-type nitride layer has consistent mixed polarity with the n-type nitride layer, and the surface far from the n-type nitride layer is a connected gallium polarity surface.

14 Claims, 14 Drawing Sheets

LIGHT EMITTING DIODE AND FABRICATION METHOD THEREOF

CROSS-REFERENCE TO RELATED APPLICATIONS

The present application is a continuation of, and claims priority to, PCT/CN2016/097806 filed on Sep. 1, 2016, which claims priority to Chinese Patent Application No. 201510820041.X filed on Nov. 24, 2015. The disclosures of these applications are hereby incorporated by reference in their entirety.

BACKGROUND

In recent years, as the substrate transfer technology gets mature, the vertical-structure chip technology has been increasingly applied in the field. Generally, deposit a GaN-based thin film over the sapphire substrate via Metal-Organic Chemical Vapour Deposition (MOCVD), then bond the GaN-based thin film to the semiconductor or metal base via wafer bonding technology or electroplating technique, and finally lift off the sapphire substrate. Thanks to its high light extraction efficiency, current extension capacity and thermal conduction capability, the technology effectively improves light-emitting efficiency of the GaN-based LED chip, showing increasingly prominent advantage particularly in application fields of high current, large density and high power.

SUMMARY

The inventors of the present disclosure have recognized that, in the aforesaid vertical-structure chip technology, the exposed GaN thin film surface after substrate lift-off is generally a nitride polarity surface. The metal-semiconductor contact properties of the nitride polarity and the gallium polarity surfaces differ greatly, and conventional Ti/Al metal electrodes can form extremely stable ohmic contact with the gallium polarity GaN, but hardly obtain stable ohmic contact with the nitride polarity GaN. After failure, the forward voltage rises, which greatly deteriorates the property stability of the vertical GaN chip.

To solve the aforementioned problem, various embodiments disclosed herein provide a vertical light-emitting diode with good n-type ohmic contact and the fabrication method thereof, to improve the chip voltage reliability due to poor stability of the n-surface GaN ohmic contact electrode of existing vertical chip.

In an aspect, various embodiments of a LED epitaxial structure for the vertical chip are provided, including: a substrate, having an upper surface and a bottom surface opposite to each other, in which, a portion of the upper surface is nitrided; an n-type nitride layer, formed on the upper surface of the substrate having a nitride polarity crystal and a gallium polarity crystal, wherein, the nitride polarity crystal is grown above the nitrided region of the substrate, and the surfaces of the nitride polarity and the gallium polarity regions appear different in height; an n-type recovery layer, formed on the n-type nitride layer, wherein, the upper surface is a connected gallium polarity surface; an active layer, formed on the n-type recovery layer; and a p-type layer, formed on the active layer.

In another aspect, various embodiments of a vertical LED chip are provided, including from bottom to up: a conductive substrate, a p-type nitride layer, an active layer, an n-type recovery layer, an n-type nitride layer and an n electrode.

The n-type nitride layer has a nitride polarity crystal and a gallium polarity crystal, and the surfaces of the nitride polarity and the gallium polarity regions appear different in height, the surface at the side of the n-type recovery layer approximate to the n-type nitride layer has consistent mixed polarity with the n-type nitride layer, and the surface at the side far from the n-type nitride layer is a connected gallium polarity surface.

In some embodiments of the aforesaid LED epitaxial structure, the nitrided region of the substrate upper surface is a periodically-arranged band-shaped or block-shaped pattern, with size of 10-200 nm.

In some embodiments, in the aforesaid LED epitaxial structure and chip, the nitride polarity crystal and the gallium polarity crystal of the n-type nitride layer are alternatively arranged; the n-type recovery layer is 0.3-1 μm thick with doping concentration of 2e17-5e18 $cm^{-3}$; and at least half of the upper surface of the n-type nitride layer is a gallium polarity surface.

In another aspect, a fabrication method for a vertical LED chip is provide, including the following steps: 1) providing a substrate having an upper surface and a bottom surface opposite to each other, and nitriding a portion of the upper surface; 2) growing an n-type nitride layer having a nitride polarity crystal and a gallium polarity crystal on the upper surface of the substrate, wherein, the nitride polarity crystal is grown above the nitrided region of the substrate, and the surfaces of the nitride polarity and the gallium polarity regions appear different in height; 3) growing an n-type recovery layer on the n-type nitride layer, wherein, the upper surface is a connected gallium polarity surface; 4) growing an active layer and a p-type nitride layer in sequence on the n-type recovery layer, to form a LED epitaxial structure; 5) providing a conductive substrate, and connecting the conductive substrate to one side surface of the p-type nitride layer of the aforesaid LED epitaxial structure; and 6) removing the substrate of the LED epitaxial structure to expose the surface of the n-type nitride layer, and fabricating an n electrode thereon.

In some embodiments, in step 1), the nitrided region on the substrate upper surface is a periodically-arranged band-shaped or block-shaped pattern, with size of 10-200 nm.

In some embodiments, in step 3), improve lateral epitaxial capacity of the gallium polarity region by controlling growth temperature, pressure and growth rate, and form a connected gallium polarity surface after completion.

In some embodiments, in step 3), the growing temperature is 1,100-1,150° C., the pressure is 100-150 torr, and the growing rate is below 1 μm/h.

In some embodiments, in step 6), remove the substrate to expose the epitaxial structure surface, and etch the exposed surface with wet etching, and form surfaces with height difference on the surface of the n-type nitride layer.

In some embodiments, the LED epitaxial structure, as a portion of the substrate, is nitrided at first, the subsequently grown n-type nitride layer has mixed polarity in the same rule with the substrate nitriding technology. Meanwhile, as the growing rate of the nitride polarity is slightly lowered than that of the gallium polarity, the nitride polarity and the gallium polarity regions on the surface appear different in height regularly. After substrate lift-off in subsequent vertical chip process, the nitride polarity and the gallium polarity on the exposed n-type nitride layer surface are in mixed arrangement. When an n-type ohmic contact electrode is fabricated on this n-type nitride layer, a mature Ti/Al metal electrode can be directly used to improve ohmic contact stability of the nitride polarity surface, thus ensuring voltage stability of the GaN-based thin film light-emitting device.

In another aspect, a light-emitting system is provided including a plurality of the LEDs. The light-emitting system can be used for lighting, display, signage, etc.

Other features and advantages of various embodiments of the present disclosure will be described in detail in the following specification, and it is believed that such features and advantages will become more apparent in the specification or through implementations of various embodiments disclosed herein. The purposes and other advantages of the embodiments can be realized and obtained in the structures specifically described in the specifications, claims and drawings.

BRIEF DESCRIPTION OF THE DRAWINGS

The accompanying drawings, which are included to provide a further understanding of the various embodiments disclosed herein and to constitute a part of this specification, together with the embodiments, are therefore to be considered in all respects as illustrative and not restrictive. In addition, the drawings are merely illustrative, which are not drawn to scale.

DETAILED DESCRIPTION

Various embodiments of the present disclosure will be described in detail with reference to the accompanying drawings and examples. In specific device design and manufacture, the LED structures according to various embodiments in the present disclosure can be adjusted and changed to some extent in terms of structure and dimension and the material selection based on the need in specific application fields and process applications.

Figure 1:
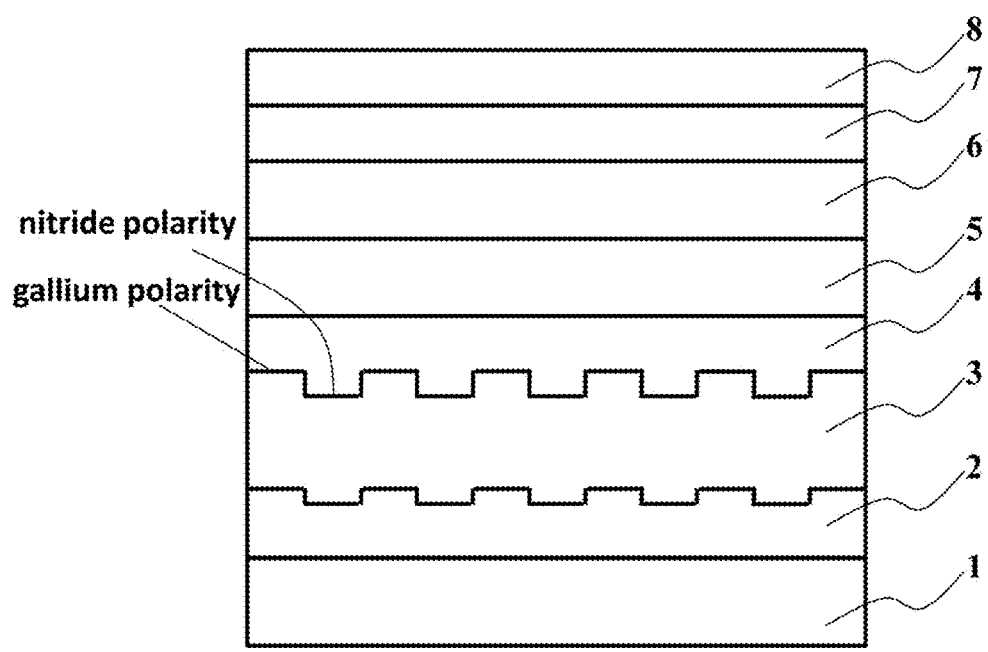
FIG. 1 shows a sectional view of a schematic diagram of an LED epitaxial vertical structure according to some embodiments.

FIG. 1 shows a section-view schematic diagram of a LED epitaxial structure for vertical structure according to some embodiments.

With reference to FIG. 1, a LED epitaxial structure, including from bottom to up: a substrate 1, a u-type nitride layer 2, an n-type nitride layer 3, an n-type recovery layer 4, an n-type super-lattice structure layer 5, an active layer 6, a p-type nitride layer 7 and a p-type contact layer 8.

In some embodiments, the substrate 1 is sapphire, and its surface structure is a plane structure. A portion of the upper surface of the substrate 1 is nitrided, wherein, the nitrided region is in band-shape or block-shape. With reference to patterns shown in FIGS. 4 and 5, the black portion indicates that the substrate surface is nitrided, and the alternating black-and-white band-shape or block-shape indicates alternating nitrided or non-nitrided regions on the substrate surface. The proportion of the nitrided and non-nitrided regions mainly depends on two factors below: first, the nitrided area should not be too small. That means, the n-type nitride layer should have sufficient gallium polarity surface area for fabricating the n-type ohmic contact electrode; and second, the nitrided area should not be too large. Otherwise it may be difficult to grow a nitride layer. With comprehensive consideration of the aforesaid two factors, preferable value is 3:7-7:3, and most preferable value is 1:1.

Form an unintentionally-doped nitride layer (u-type nitride layer for short) 2 on the surface of the substrate 1, generally including a 20-50 nm low-temperature buffer layer, a 1-2 μm 3D nitride layer and a 1-2 μm 2D nitride layer. The u-type nitride layer 2 is composed of nitride layers with alternating gallium polarity and nitride polarity. The surfaces of the nitride polarity and the gallium polarity regions appear different in height, wherein, the nitride layer of nitride polarity is above the nitrided region of the substrate.

Form an n-type nitride layer 3 on the surface of the u-type nitride layer 2, similarly, being composed of nitride layers with alternating gallium polarity and nitride polarity, which can be GaN layers or AlGaN layers doped with Si, Ge, Se, or Te with thickness of 1.5-4 μm. As the growing rate of the nitride polarity nitride is slightly lower than that of the gallium polarity nitride, surfaces of the nitride polarity and the gallium polarity regions have increasing difference in height.

Form an n-type recovery layer 4 on the surface of the n-type nitride layer 3, which can be Si-doped GaN material. The lateral epitaxial capacity of the gallium polarity region is improved by controlling growth temperature, pressure and growth rate during growth to form an upper surface with connected Ga polarity surfaces. In some embodiments, the n-type recovery layer 4 is 0.3-1 μm thick with doping concentration of 2E17-5E18 $cm^{-3}$.

Form an n-type super-lattice structure layer 5 on the surface of the n-type recovery layer, which can be a multi-layer structure of carbon nitride or nitride containing II, III or IV-group elements, such as InGaN/GaN, AlGaN/GaN, InGaN/GaN/AlGaN, or AlGaN/GaN/InGaN, etc.

Form an active layer 6 on the surface of the n-type super-lattice layer 5, which can be a multiple-quantum well structure, in which the InGaN layer is the well layer and the GaN layer is the barrier layer, wherein, film thickness of the well layer is 18-30 Å, and film thickness of the barrier layer is 80-200 Å.

Form a p-type nitride layer 7 with thickness of 50-150 nm on the surface of the active layer 6. Insert a Mg-doped AlInGaN layer between the p-type nitride layer 7 and the active layer 6 as the electron blocking layer with thickness of 10-30 nm.

Form a p-type contact layer 8 on the surface of the p-type nitride layer 7, with heavily-doped p-type GaN with thickness of 5-10 nm.

Figure 2:
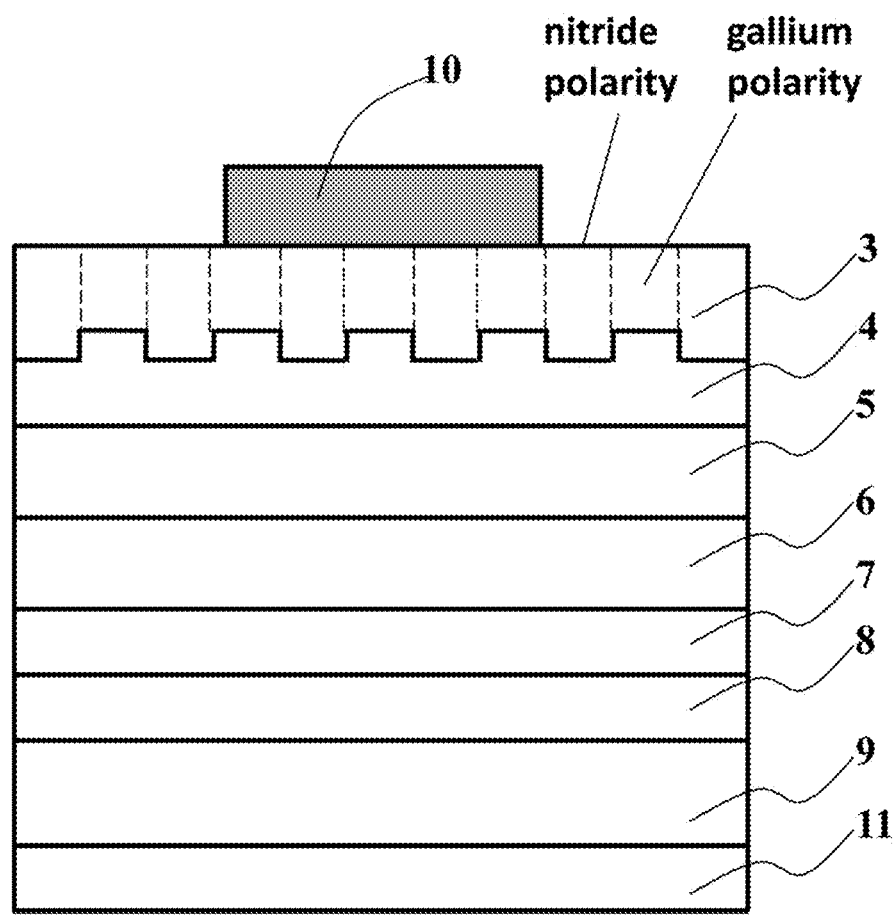
FIG. 2 shows a sectional view of a schematic diagram of a vertical LED chip with good n-type ohmic contact according to some embodiments.

FIG. 2 illustrates a section-view schematic diagram of a vertical LED chip with good n-type ohmic contact according to some embodiments.

With reference to FIG. 2, flip-chip bond the LED epitaxial structure as shown in FIG. 1 to the surface of the conductive substrate 9, and remove the substrate 1 and the u-type nitride layer 2, wherein, the surface of the exposed n-type nitride layer 3 has mixing arrangement of nitride polarity and gallium polarity. Form an n-type ohmic contact electrode 10, which is directly an Ti/Al metal electrode, on the surface of the n-type nitride layer 3.

Figure 3:
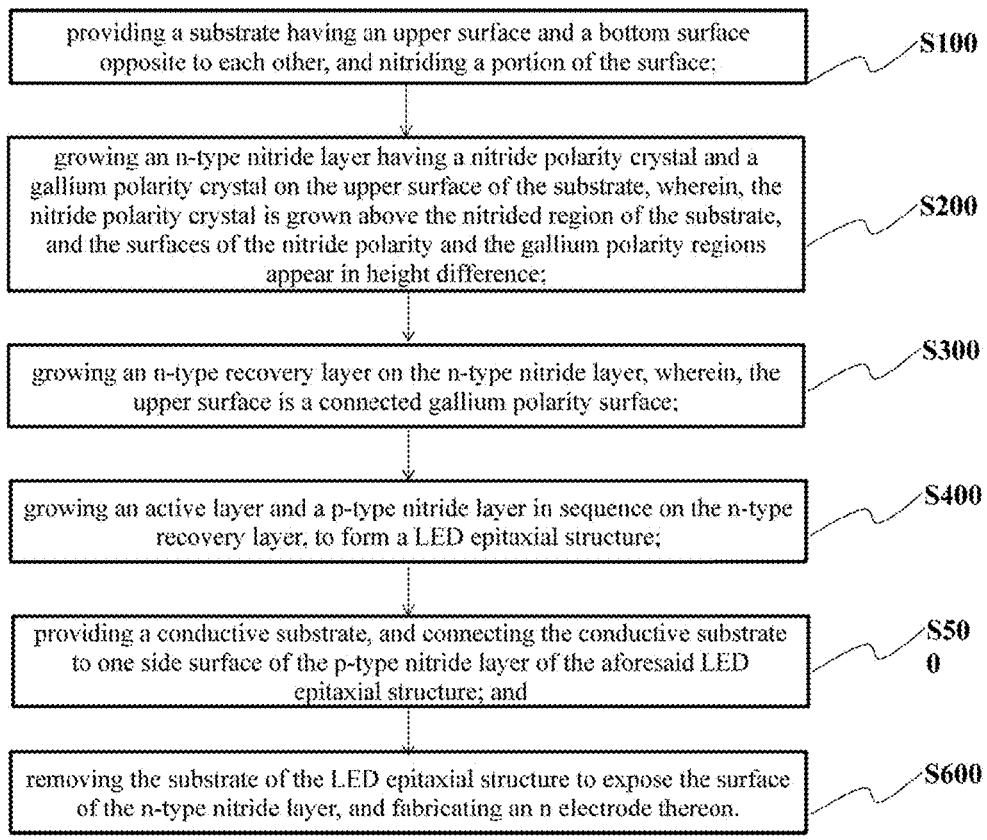
FIG. 3 is a flowchart of a method of fabricating a vertical LED chip.

FIG. 3 shows a schematic diagram for fabricating a vertical LED chip, including steps S100-S600, wherein, steps S100-S400 are epitaxy process, and S500-S600 are chip process. Details will be given below with combination of FIGS. 4-12.

Figure 4:
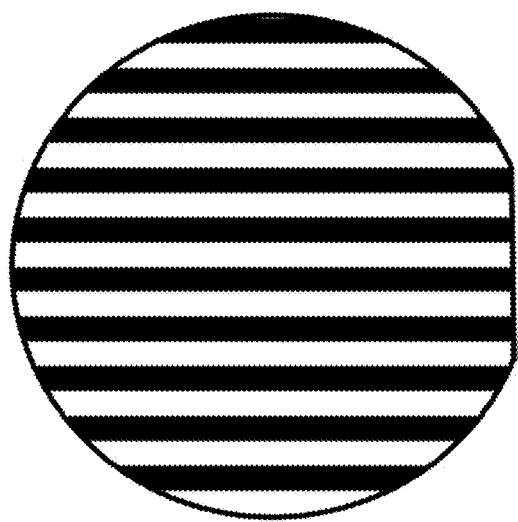
FIG. 4 illustrates a first step of a fabrication process of a vertical LED chip according to some embodiments.
Figure 5:
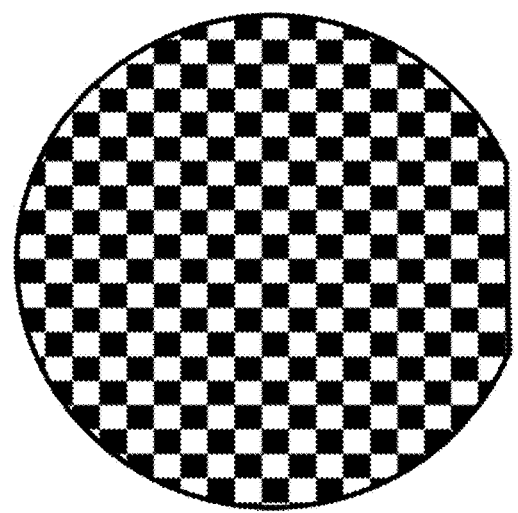
FIG. 5 illustrates a second step of a fabrication process of a vertical LED chip according to some embodiments.

S100: provide a plain substrate 1, and nitride a portion of the upper surface of the substrate. As shown in FIGS. 4-5, the black portion indicates that the substrate surface is nitrided, and the black-and-white band-shape or block-shape indicates alternating nitrided or non-nitrided regions on the substrate surface. In some embodiments, fabricate a band-shape or block-shape region mask on the substrate surface with mask pattern cycle size of 10-200 nm; input $NH_3$ or other N sources to nitride the non-mask region of the surface via MOCVD or other devices under high temperature; and remove the mask.

Figure 6:
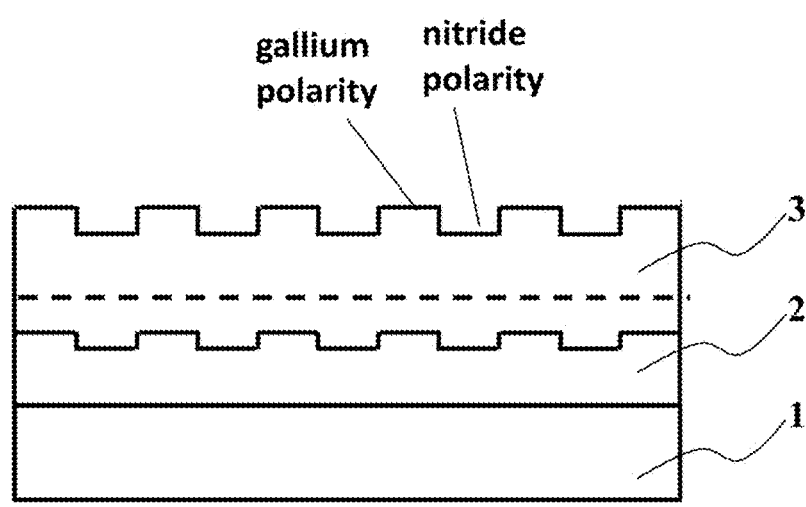
FIG. 6 illustrates a third step of a fabrication process of a vertical LED chip according to some embodiments.

S200: grow a u-type nitride layer and an n-type nitride layer on the upper surface of the aforesaid substrate, with mixing arrangement of nitride polarity and gallium polarity, and the surfaces of the nitride polarity and the gallium polarity regions appear different in height, wherein, the nitride polarity crystal is grown on the nitrided region of the substrate, as shown in FIG. 6. In some embodiments: put the substrate into the MOCVD chamber, and input $H_2$ for high-temperature processing of the surface for 5-10 minutes by rising temperature to 1,100-1,150° C., and lowering pressure to 100-300 torr; input ammonia and trimethyl gallium and grow a 20-50 nm low-temperature buffer layer by lowering temperature to 500-600° C. and rising pressure to 300-500 torr, and then cut off the trimethyl gallium; anneal for 1-5 minutes by rising and maintaining temperature to 1,000-1,100° C. and keeping pressure at 300-500 torr, and input trimethyl gallium for growing a 1-2 μm non-doped gallium nitride; grow a 1-2 μm thick non-doped gallium nitride by continuing rising temperature to 1,050-1,150° C. and lowering pressure to 200-300 torr; and grow a 1.5-4 μm n-type gallium nitride by lowering temperature to 1,030-1,120° C. and keeping pressure at 200-300 torr, and input silane for doping. As a portion of the substrate is nitrided, the epitaxial layer would appear the same mixing polarity with the substrate nitrided pattern after growing the n-type GaN layer. However, as the growing rate of the nitride polarity is slightly lowered than that of the gallium polarity, the nitride polarity and the gallium polarity regions on the surface appear difference in height regularly.

Figure 7:
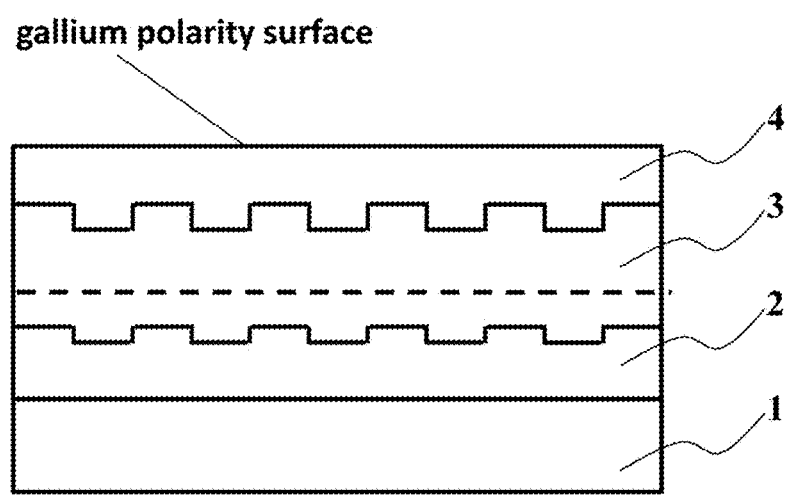
FIG. 7 illustrates a fourth step of a fabrication process of a vertical LED chip according to some embodiments.

S300: form an n-type recovery layer 4 on the n-type nitride layer 3 and improve lateral epitaxial capacity of the Ga polarity region by controlling growth temperature, pressure and growth rate, and form a connected gallium polarity surface after completion, as shown in FIG. 7. In some embodiments, grow a 0.3-1 μm-thick n-type GaN recovery layer with Si doping concentration of 2e17-5e18 $cm^{-3}$ by rising temperature to 1,100-1,150° C., lowering pressure below 100-150 torr and lowering growing rate below 1 μm/h.

Figure 8:
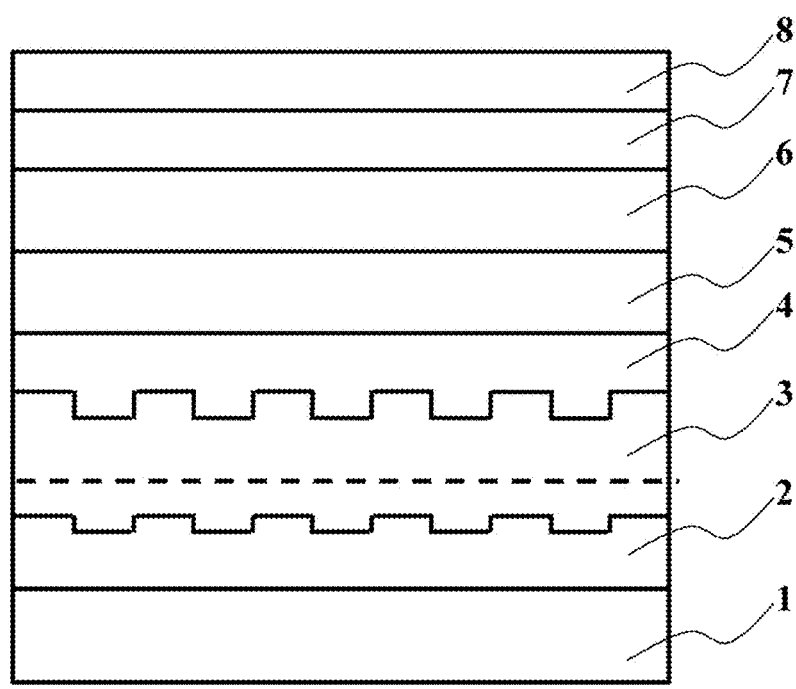
FIG. 8 illustrates a fifth step of a fabrication process of a vertical LED chip according to some embodiments.

S400: grow an n-type super-lattice structure layer 5, an active layer 6, a p-type nitride layer 7 and a p-type contact layer 8 in sequence on the n-type recovery layer 4 to form a LED epitaxial structure, as shown in FIG. 8. In some embodiments, first, grow an InGaN/GsN super-lattice layer with 10-30 cycles by lowering temperature to 750-900° C. and rising pressure to 200-300 torr, wherein, within each cycle, the InGaN is 1-3 nm thick, and the GaN is 2-10 nm thick; next, grow an InGaN/GaN multi-quantum well layer with 4-15 cycles by rising temperature to 750-900° C. and keeping pressure at 200-300 torr, wherein, within each cycle, the InGaN is 2-4 nm thick and the GaN is 5-15 nm thick; next, grow a p-type AlGaN electron blocking layer by rising temperature to 800-950° C. and lowering pressure to 100-150 torr; next, grow a p-type GaN with thickness of 50-150 nm by rising temperature to 900-1,050° C. and pressure to 200-300 torr; finally, grow a heavily-doped p-type GaN contact layer with thickness of 5-10 nm at 900-1,050° C.

Figure 9:
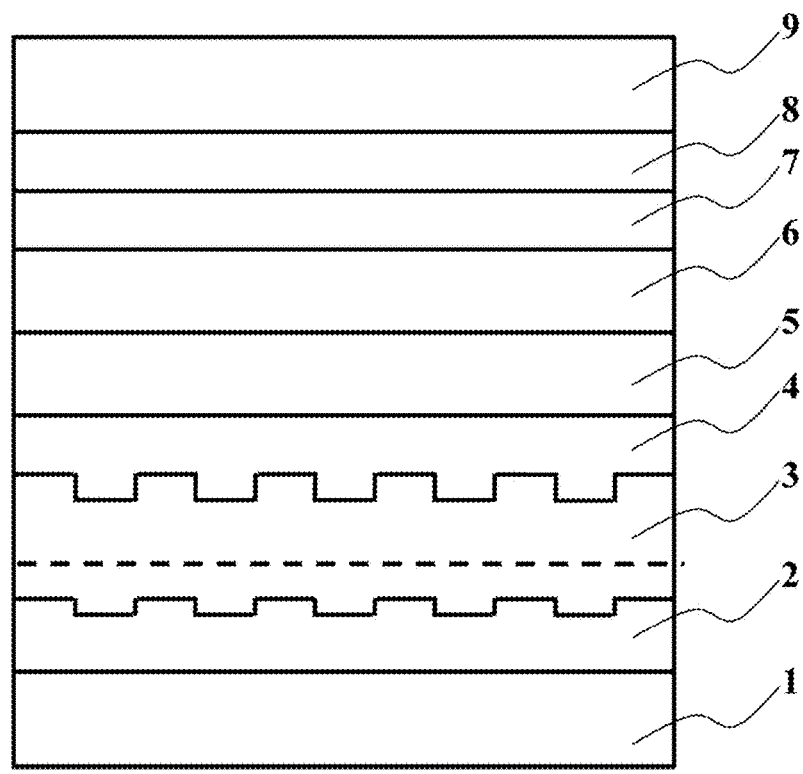
FIG. 9 illustrates a sixth step of a fabrication process of a vertical LED chip according to some embodiments.

S500: provide a conductive substrate 9, and bond the aforesaid LED epitaxial structure to the conductive substrate 9 via wafer bonding technology or electroplating technology, as shown in FIG. 9. In some embodiments, the conductive substrate 9 can be a Si-substrate or other metal substrates with good thermal conductivity. Use a bonding layer with good thermal conductivity and strong mechanical bonding force for bonding, such as Au, Ag, Cu, Pt, Pd, Al. In some embodiments, a reflector system can be set between the conductive substrate 9 and the p-type contact layer 8.

Figure 10:
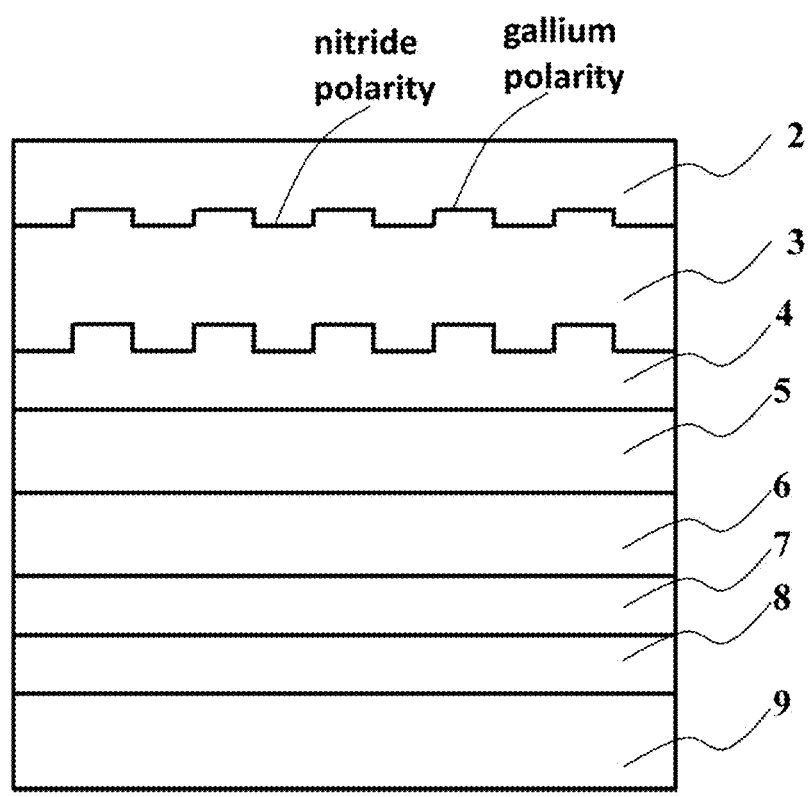
FIG. 10 illustrates a seventh step of a fabrication process of a vertical LED chip according to some embodiments.
Figure 11:
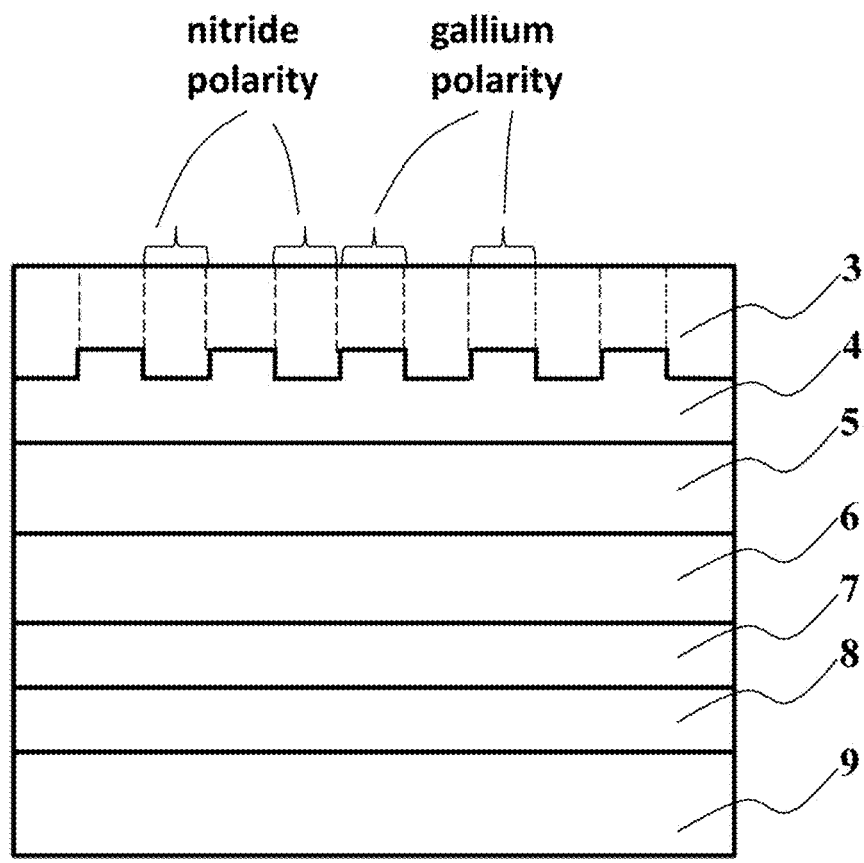
FIG. 11 illustrates an eighth step of a fabrication process of a vertical LED chip according to some embodiments.
Figure 12:
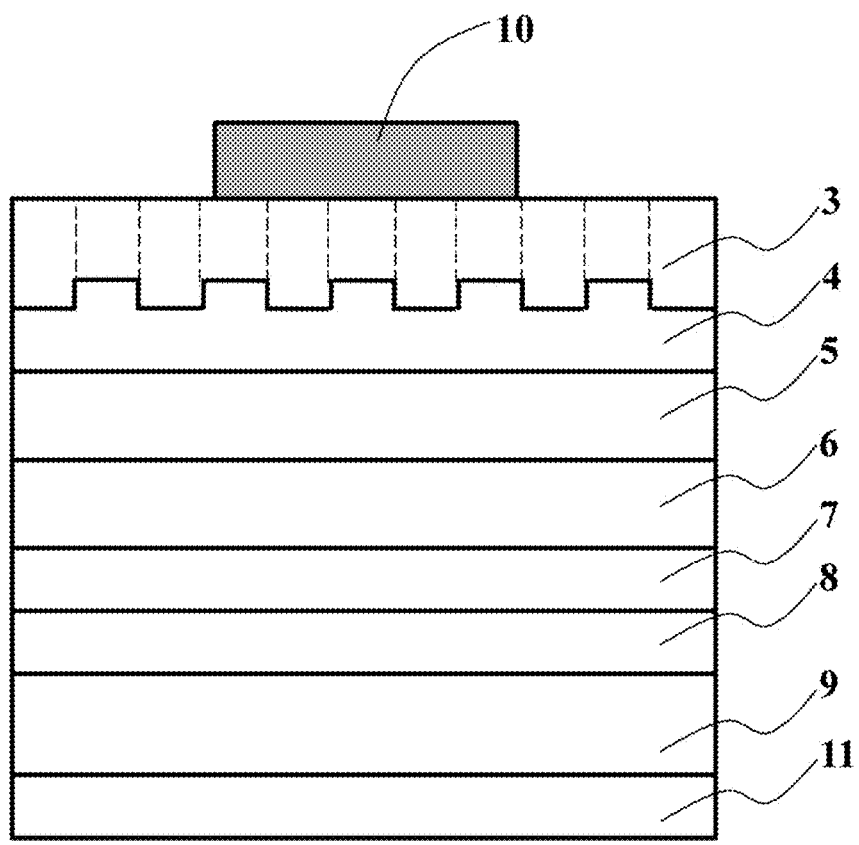
FIG. 12 illustrates a ninth step of a fabrication process of a vertical LED chip according to some embodiments.

S600: remove the substrate 1 of the aforesaid LED epitaxial structure to expose the surface of the n-type nitride layer 3; fabricate an n electrode 10 thereon, and fabricate a p-electrode 11 on the back surface of the conductive substrate 9, as shown in FIG. 12. In some embodiments, remove the substrate 1 with laser lift-off, as shown in FIG. 10; next, remove the u-type nitride layer 2 via dry etching to expose the n-type nitride layer, as shown in FIG. 11, wherein, the surface of the exposed n-type nitride layer 3 has mixing arrangement of nitride polarity and gallium polarity; fabricate an n-electrode 10 on this n-type nitride layer 3 with 50% area contacting the gallium polarity nitride layer, wherein, a mature Ti/Al metal-electrode can be directly used to improve ohmic contact stability of the nitride polarity surface, thus ensuring voltage stability of the GaN-based film light-emitting device.

Figure 13:
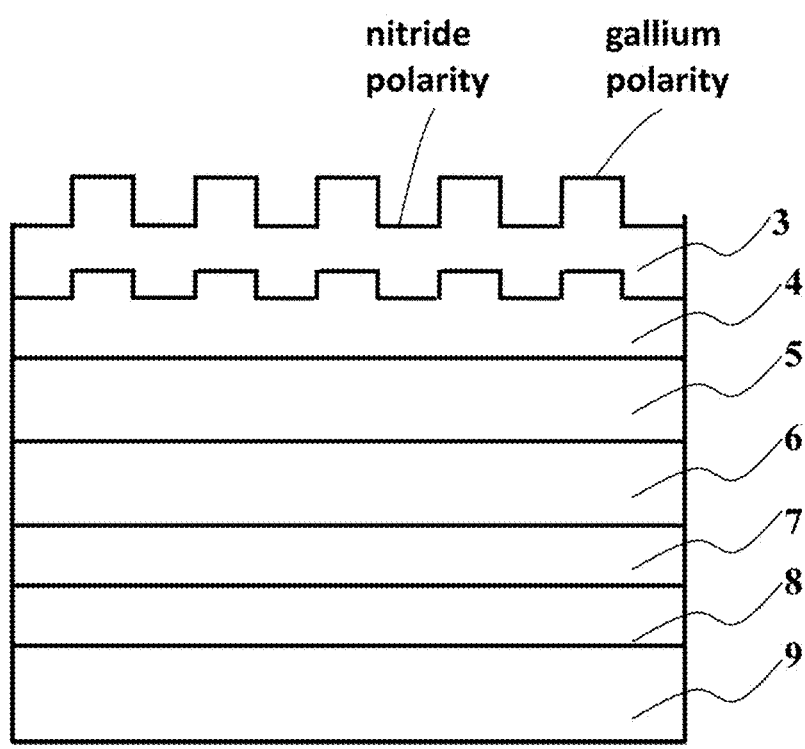
FIG. 13 illustrates a step of another fabrication method of a vertical LED chip according to some embodiments.
Figure 14:
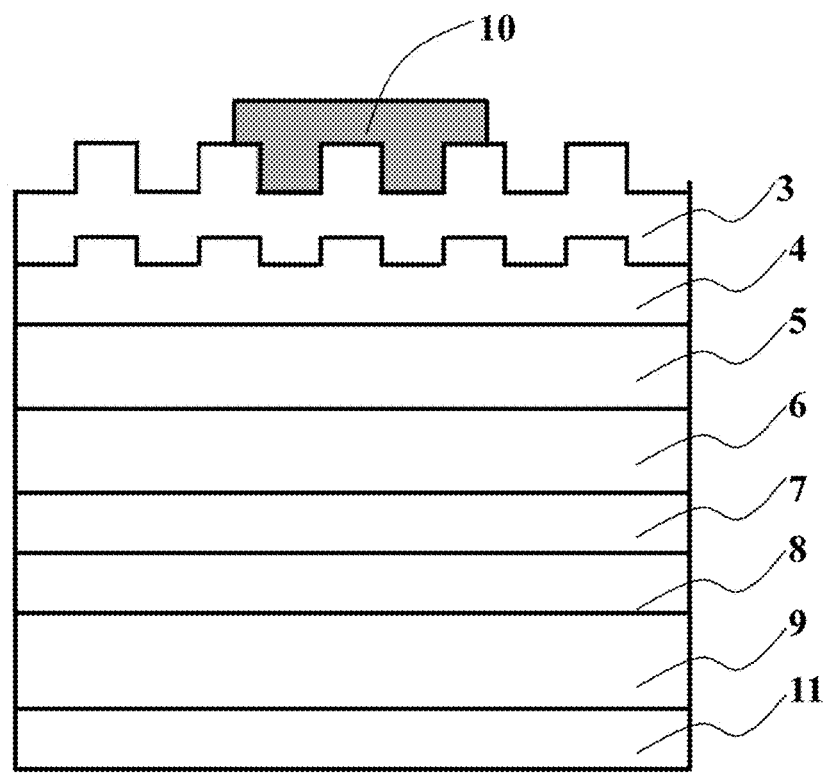
FIG. 14 illustrates another step of the other fabrication method of a vertical LED chip according to some embodiments.

FIGS. 13-14 show schematic diagrams of a part of process for another fabricating method of a vertical LED chip according to some embodiments.

In some embodiments disclosed herein, in step S600, remove the u-type nitride layer 2 with wet etching after removal of the substrate 1. As the nitride polarity region etches quickly, the convex-concave height difference of the surface is enlarged, as shown in FIG. 13. On the one hand, this can serve as the light extraction structure; and on the other hand, it enlarges the contact area between the side wall of the gallium polarity region and n-electrode, thus improving adhesiveness of the n-electrode to the epitaxial layer while reducing chip voltage.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light-emitting diode (LED) epitaxial structure, comprising:
 a substrate, having an upper surface and a bottom surface opposite to each other, wherein a portion of the upper surface is nitrided;
 an n-type nitride layer having a nitride polarity crystal and a gallium polarity crystal, formed on the upper surface of the substrate, wherein the nitride polarity crystal is grown over the nitrided portion of the substrate, and surfaces of the nitride polarity and the gallium polarity regions have different heights;
 an n-type recovery layer, formed over the n-type nitride layer, wherein the upper surface is a connected gallium polarity surface;
 an active layer, formed over the n-type recovery layer; and
 a p-type layer, formed over the active layer;
 Wherein the nitrided region on the substrate upper surface is a periodically-arranged band-shaped or block-shaped pattern, with size of 10-200 nm.

2. The LED epitaxial structure of claim 1, wherein: the nitride polarity crystal and the gallium polarity crystal of the n-type nitride layer are alternatively arranged.

3. A vertical light-emitting diode (LED) chip, comprising from bottom up:
 a conductive substrate;
 a p-type nitride layer;
 an active layer;
 an n-type recovery layer;
 an n-type nitride layer; and
 an n electrode;
 wherein: the n-type nitride layer has a nitride polarity crystal and a gallium polarity crystal, and the surfaces of the nitride polarity and the gallium polarity regions appear different in height, the n-type recovery layer surface approximate to the n-type nitride layer has consistent mixed polarity with the n-type nitride layer, and the other surface far from the n-type nitride layer is a connected gallium polarity surface.

4. The vertical LED chip of claim 3, wherein: the nitride polarity crystal and the gallium polarity crystal of the n-type nitride layer are alternatively arranged.

5. The vertical LED chip of claim 3, wherein: at least half of the upper surface of the n-type nitride layer is a gallium polarity surface.

6. The vertical LED chip of claim 3, wherein: the n-type recovery layer is 0.3-1 μm thick with doping concentration of 2E17-5E18 $cm^{-3}$.

7. A light-emitting diode (LED) epitaxial structure, comprising:
 a substrate, having an upper surface and a bottom surface opposite to each other, wherein a portion of the upper surface is nitrided;
 an n-type nitride layer having a nitride polarity crystal and a gallium polarity crystal, formed on the upper surface of the substrate, wherein the nitride polarity crystal is grown over the nitrided portion of the substrate, and surfaces of the nitride polarity and the gallium polarity regions have different heights;
 an n-type recovery layer, formed over the n-type nitride layer, wherein the upper surface is a connected gallium polarity surface;
 an active layer, formed over the n-type recovery layer; and
 a p-type layer, formed over the active layer;
 wherein: the n-type recovery layer is 0.3-1 μm thick with doping concentration of 2E17-5E18 $cm^{-3}$.

8. A fabrication method of forming the light-emitting diode (LED) epitaxial structure of claim 7, the method comprising:
 1) providing a substrate having an upper surface and a bottom surface opposite to each other, and nitriding a portion of the upper surface;
 2) growing an n-type nitride layer having a nitride polarity crystal and a gallium polarity crystal on the upper surface of the substrate, wherein, the nitride polarity crystal is grown above the nitrided region of the substrate, and the surfaces of the nitride polarity and the gallium polarity regions appear different in height;
 3) growing an n-type recovery layer on the n-type nitride layer, wherein, the upper surface is a connected gallium polarity surface;
 4) growing an active layer and a p-type nitride layer in sequence on the n-type recovery layer, to form an LED epitaxial structure;
 5) providing a conductive substrate, and connecting the conductive substrate to one side surface of the p-type nitride layer of the aforesaid LED epitaxial structure; and
 6) removing the substrate of the LED epitaxial structure to expose the surface of the n-type nitride layer, and fabricating an n electrode thereon;
 wherein the fabricated LED epitaxial structure comprises:
 the substrate, having an upper surface and a bottom surface opposite to each other, wherein a portion of the upper surface is nitrided;
 the n-type nitride layer having a nitride polarity crystal and a gallium polarity crystal, formed on the upper surface of the substrate, wherein the nitride polarity crystal is grown over the nitrided portion of the substrate, and surfaces of the nitride polarity and the gallium polarity regions have different heights;
 the n-type recovery layer, formed over the n-type nitride layer, wherein the upper surface is a connected gallium polarity surface;
 the active layer, formed over the n-type recovery layer; and
 the p-type layer, formed over the active layer.

9. The method of claim 8, wherein: in step 1), the nitrided portion on the substrate upper surface is a periodically-arranged band-shaped or block-shaped pattern, with size of 10-200 nm.

10. The method of claim 8, wherein: in step 3), improve lateral epitaxial capacity of the gallium polarity region by controlling growth temperature, pressure and growth rate, and form a connected gallium polarity surface after completion.

11. The method of claim 10, wherein: in step 3), growing temperature is 1,100-1,150° C., pressure is 100-150 torr, and growing rate is below 1 μm/h.

12. The method of claim 8, wherein: in step 6), remove the substrate to expose the epitaxial structure surface, etch the exposed surface with wet etching, and form surfaces with height difference on the n-type nitride layer surface.

13. The method of claim 8, wherein: the nitride polarity crystal and the gallium polarity crystal of the n-type nitride layer are alternatively arranged.

14. The method of claim 8, wherein: at least half of the upper surface of the n-type nitride layer is a gallium polarity surface.

* * * * *